United States Patent [19]
Falbel

[11] Patent Number: 5,979,834
[45] Date of Patent: Nov. 9, 1999

[54] SPACECRAFT SOLAR POWER SYSTEM

[76] Inventor: Gerald Falbel, 472 Westover Rd., Stamford, Conn. 06902

[21] Appl. No.: 08/850,325

[22] Filed: May 2, 1997

[51] Int. Cl.$^6$ ............................ B64G 1/44; H01L 31/042; H01L 31/045
[52] U.S. Cl. .......................... 244/173; 136/245; 136/246; 136/292; 126/685
[58] Field of Search ............................ 244/173; 136/245, 136/246, 292; 126/685, 686; 52/108

[56] References Cited

U.S. PATENT DOCUMENTS

| | | | |
|---|---|---|---|
| 3,171,403 | 3/1965 | Drescher | 126/685 |
| 4,133,501 | 1/1979 | Pentlicki | 244/173 |
| 4,230,095 | 10/1980 | Winston | 126/685 |
| 4,282,394 | 8/1981 | Lackey et al. | 136/245 |
| 4,421,104 | 12/1983 | Adcock | 126/685 |
| 4,787,580 | 11/1988 | Ganssle | 244/173 |
| 5,498,297 | 3/1996 | O'Neill et al. | 136/246 |
| 5,660,644 | 8/1997 | Clemens | 136/245 |

FOREIGN PATENT DOCUMENTS 027425  2/1991  Japan .
331486  5/1991  Japan .

Primary Examiner—Galen L. Barefoot
Assistant Examiner—Patricia L. Zuniga
Attorney, Agent, or Firm—Mark P. Stone

[57] ABSTRACT

A solar power system for orbiting spacecraft includes a collector surface and attached mirror which is retained in a coiled position around the outer surface of the spacecraft in its launch mode. The system is deployed from the orbiting spacecraft by releasing restraining straps and permitting the mirror and attached collector surface to automatically uncoil as a result of the resilient spring characteristics of the mirror. During orbit, the deployed system extends from one side or both sides of the spacecraft such that the mirrored surface faces the sun. Heating pipes are pivotably disposed between the mirror and the collector surface to also function as spacing struts. The collector surface covered with photovoltaic solar cells made of silicon or Gallium Arsenide-Phosphide (GaAsP) in a first embodiment of the invention, can be replaced by a flat heat pipe for conducting heat energy to the input of an external heat engine electric generator in a second embodiment of the invention.

32 Claims, 5 Drawing Sheets

SPACECRAFT SOLAR POWER SYSTEM

BACKGROUND OF THE INVENTION

The present invention is directed to solar power systems for spacecraft, and in particular, improved, lightweight high efficiency solar energy systems for powering spacecraft during long missions in space.

In order to operate during long missions in space, spacecraft generally use solar cell panels to collect solar irradiance and convert it into electrical power to operate the spacecraft attitude control systems, communications, and payloads. Typical spacecraft in geosynchronous orbits (36,800 Km. altitude above the earth surface) require continuous solar power of 3,000 to 60,000 watts. Typical existing solar panels use silicon photocells arranged in two dimensional arrays on a lightweight honeycomb backing. These panels fold up accordion style during launch and unfold once in geosynchronous orbit, where the spacecraft remains above a predesignated geographical point on the earth. At geosynchronous orbit, the earth subtends only 17.5 degrees, and therefore blocks the sun for only 1.16 hours maximum during the Spring and Fall Equinoxes, and not at all during the solstices.

Silicon photocells used without optical concentration provide efficiencies of 12 to 15%, and degrade in output at increased temperatures and as a result of exposure to large quantities of Van Allen radiation. Gallium Arsenide Phosphide (GaAsP) solar cells provide higher efficiencies, but operate best when used in a solar concentrator.

At their present high state of development, solar panels for spacecraft are evaluated on so-called "Figures of Merit" such as watts/Kg. or watts/dollar. It is the primary object of the present invention to provide a solar powered system for an orbiting spacecraft exhibiting significant advantages in such "Figures of Merit". This object is achieved by providing a lightweight, high efficiency solar power system for a spacecraft which automatically deploys from its launch to its operating mode, in a very simple and space-efficient manner, as will be discussed herein.

SUMMARY OF THE INVENTION

In accordance with the present invention, a solar energy system for powering an orbiting spacecraft includes a mirrored surface pivotably connected to a substrate containing solar photovoltaic cells. The mirror and the substrate are connected by at least one heat conductive element (e.g., heat pipe) disposed therebetween and hingedly connected to the substrate and the mirror, thereby also functioning as a strut and spacer element between the mirror and the substrate surface. In the launch mode of the solar power system, the mirror and the panel are folded into a collapsed position, and the collapsed assembly is coiled around the outer surface of the spacecraft. The mirror is formed from a resilient material, and is retained in its coiled position around the outer surface of the spacecraft by suitable restraining means, as for example, fusible straps. When the spacecraft is in orbit, the solar power system is deployed by releasing the restraining straps to permit the mirror, and thus the connected solar panel, to automatically uncoil as a result of the spring characteristic of the mirror so that the mirror and the substrate extend longitudinally outward from one side of the spacecraft. The deployed system is oriented such that the mirror surface faces the sun. When the system is uncoiled, the substrate containing the photocells is automatically moved into its extended operating position relative to the uncoiled mirror, which is arcuate in section, as a result of outward relative movement of the mirror and substrate and the abrupt termination of the movement of the fully uncoiled mirror causing the still moving substrate to pivot into its displaced position relative to the mirror. In the alternative, means can be provided for applying a resilient force to the opposed ends of the connecting heating pipes to pivot the substrate into its displaced position relative to the mirror when the mirror is uncoiled. This final positioning of the extended mirror and substrate is also determined by the mechanical attachment of one end of the mirror and substrate to the spacecraft solar panel tracking arm.

The system is therefore automatically deployed by releasing the restraining means to uncoil the mirror and substrate when the spacecraft is in orbit. The substrate is thereafter automatically displaced into is extended operating position relative to the longitudinally extending mirror as a result of the spring forces applied by the cylindrical mirror and the substrate by the ends of the connecting element (e.g., the heat pipe), and these applied spring forces are unopposed when the mirror and the substrate are uncoiled. In its deployed operating position, the cylindrical mirror, which faces the sun, reflects and concentrates sunlight onto the substrate containing the solar collector (photocells) for generating electrical power for the orbiting spacecraft.

In a further aspect of the invention, the substrate containing the solar collectors are replaced with a flattened, continuous heat conductive surface which has high absorptivity to sunlight. The mirror and the heat conductive surface are pivotably mounted to each other by at least one heat insulating connecting element (e.g., spacing strut). The launch mode and the deployment mode of this embodiment of the invention are the same as discussed with respect to the first embodiment of the invention—the mirror is coiled around the outer surface of the spacecraft during launch, and is automatically deployed by releasing the retaining means and permitting the mirror to uncoil into an extended longitudinal position. The mirrored surface faces the sun, and sunlight is reflected from the mirrored surface onto the heat conductive surface. The heat energy flows along the surface and is provided as the input to a generator (e.g., a Stirling Cycle Engine Electric Generator) for converting thermal energy into electrical energy.

DESCRIPTION OF THE PREFERRED EMBODIMENTS OF THE INVENTION

Figure 1:
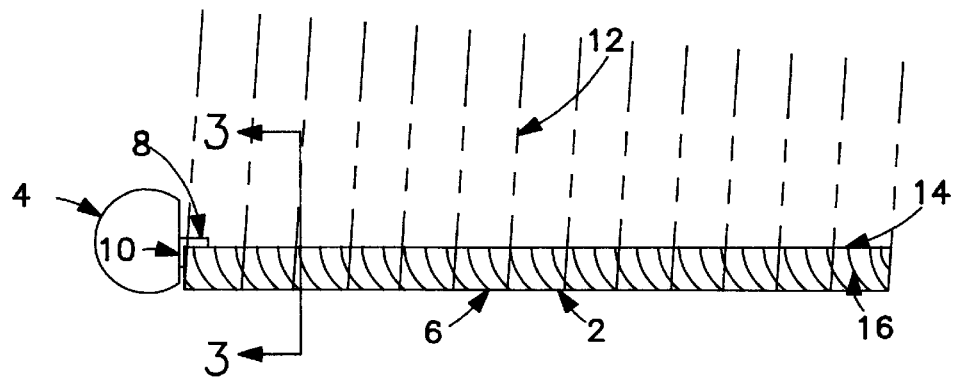
FIG. 1 schematically illustrates a solar collector system in accordance with the present invention (in its approximate relative dimensional scale) in its deployed position extending outwardly from an orbiting spacecraft, which for a geosynchronous orbit, would be aligned with the earth's polar axis.
Figure 2:
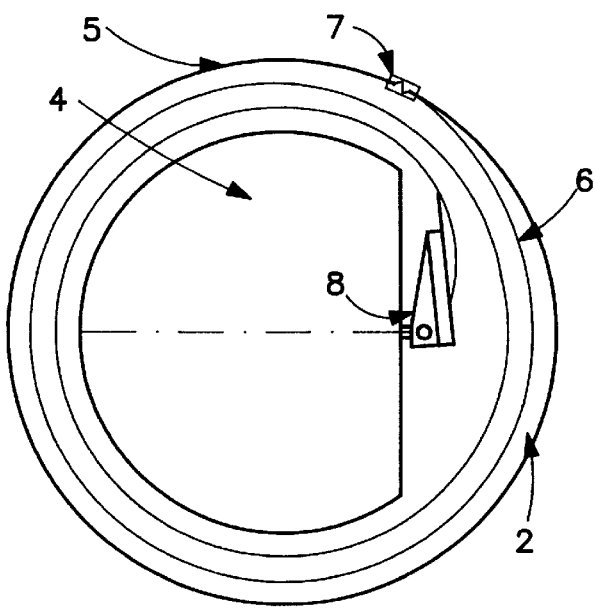
FIG. 2 illustrates the solar collector system of FIG. 1 in its coiled launch position.

FIGS. 1 and 2 illustrate, respectively, a first embodiment of a solar power concentrating system for a spacecraft in its deployed mode and its launch mode. The solar power system is designated generally by the reference numeral 2 and the spacecraft to which it is mounted is designated generally by the reference numeral 4. The system 2 includes a mirror for reflecting rays from the sun onto solar photocells mounted on a substrate. The mirror, which is generally designated by reference numeral 6, is a cylindrical mirror having a front surface, (i.e., the surface which faces the sun when the mirror is deployed from the spacecraft) which is coated with a highly reflectable material, such as silver teflon which has a reflectance of greater than 90 percent for the wavelength range in which most of the sun's energy is located, and having high emissitivity in the long wavelength region (to allow dissipation of waste heat by radiation). The rear surface of the mirror is coated black to allow a near unity emissitivity heat radiation in a direction away from the sun. The mirror is formed from a resilient or flexible material which can be coiled around at least a portion of the outer surface of the spacecraft and maintained in the coiled position by retaining means, but is biased in a longitudinal orientation and has "memory" so it will automatically assume a straight configuration with a cylindrical or arcuate cross-section and longitudinally extend from the spacecraft when the retaining means are released. Preferably, the cylindrical coiled mirror is formed from a lightweight material, as for example, aluminum, magnesium or beryllium.

FIG. 2 illustrates the mirror 6 coiled around the outer surface of the spacecraft 4 when the system is in its launch mode. The mirror is retained in its coiled position by suitable retaining means 5, as for example circumferential, fusible belt-straps wrapped around the outside of the coiled mirror incorporating a fusible link 7. The proximal end of the mirror 6 is mounted to the outside of the spacecraft by mounting means designated by reference numeral 8. The mounting means are oriented relative to the spacecraft such that when the retaining means are released (for example, by fusing the fusible retaining straps) and the resilient mirror automatically assumes its deployed position in which it longitudinally extends from the outer surface of the spacecraft (see FIG. 1), the reflective surface of the mirror is oriented relative to the spacecraft such that it always faces in a direction towards the sun to receive energy rays emitted from the sun. Although FIG. 2 illustrates that the mirror 6 is coiled twice around the outer surface of the spacecraft, this is shown for illustrative purposes only and a greater or lesser number of coils is within the scope of the present invention.

Although only a single coiled mirror is shown, it is possible to coil two such mirror/substrate assemblies interleaved so that when extended, they deploy at opposite ends of the spacecraft. However, this configuration may produce interference and possibly injurious contact during deployment, and therefore this modification is not currently considered to be the preferred embodiment of the present invention.

FIG. 1 illustrates the cylindrical mirror 6 in its uncoiled, deployed position extending longitudinally from the outer surface 10 of the spacecraft 4. The surface 10 of the orbiting spacecraft is the side of the craft which always faces in the direction of the sun so that the extended mirror 6 is oriented, in its deployed position, so that incoming rays from the sun, designated by reference numeral 12, are received and reflected by the front reflective surface of the mirror. FIG. 1 also illustrates a solar cell substrate panel generally designated by reference numeral 14. A plurality of connecting elements or struts 16 (which, as will be described below, are formed from heat conductive materials and comprise heat pipes in addition to supporting struts) are disposed between the solar cell substrate 14 and the reflective mirror 6 when the solar power system 2 is in its extended, deployed operating position as illustrated by FIG. 1. As shown in the drawing, the connecting elements 16 are curved in shape.

Figure 3:
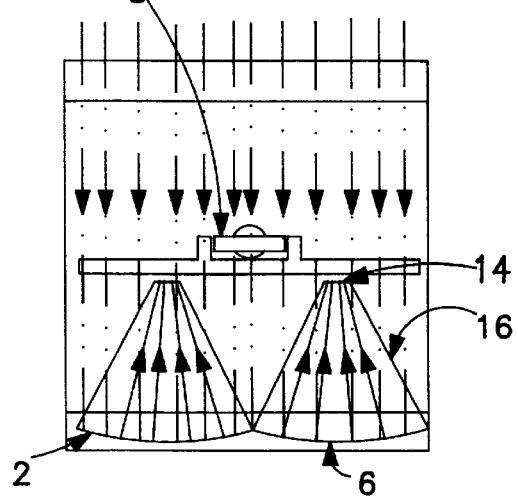
FIG. 3 illustrates a scaled-up sectional view of the deployed solar collector system as viewed along directional arrows 3—3 of FIG. 1.

FIG. 3 is a sectional view of the solar power system 2 in its deployed position showing the incoming rays 12 from the sun being reflected by the reflective surface of the cylindrical mirror 6 and being concentrated on the surface of substrate 14. The substrate surface contains photocells (e.g., GaAsP solar cells), and the substrate 14 is preferably formed from 2.0 inch wide aluminum or magnesium material of substantially 0.1 inch thickness provided in 12 inch long flat panel sections. (In the preferred embodiment of this system, a plurality of separate panels 14, each containing solar cells, are hingedly joined together). It is noted that this type of substrate provides the additional advantage of Van Allen radiation shielding to increase the life of the solar cells, and to also provide a thermally conductive material for permitting heat to flow along the substrate 14 to the thermally conductive connecting elements 16 (e.g., heat pipes) to remove heat from the substrate 14. The 2 inch wide substrate is also split into 1 inch wide by 0.1 inch thick by 12" long sections electrically insulated from each other, performing the additional function of conducting the electrical current generated by the solar cells to the spacecraft, thus saving the weight of copper electrical conductors otherwise required for this function. FIG. 3 also illustrates a pair of connecting elements 16 (heat pipes) disposed between the substrate 14 and the mirror 6 in the extended, deployed operating position of the solar power system for the orbiting spacecraft.

Figure 4:
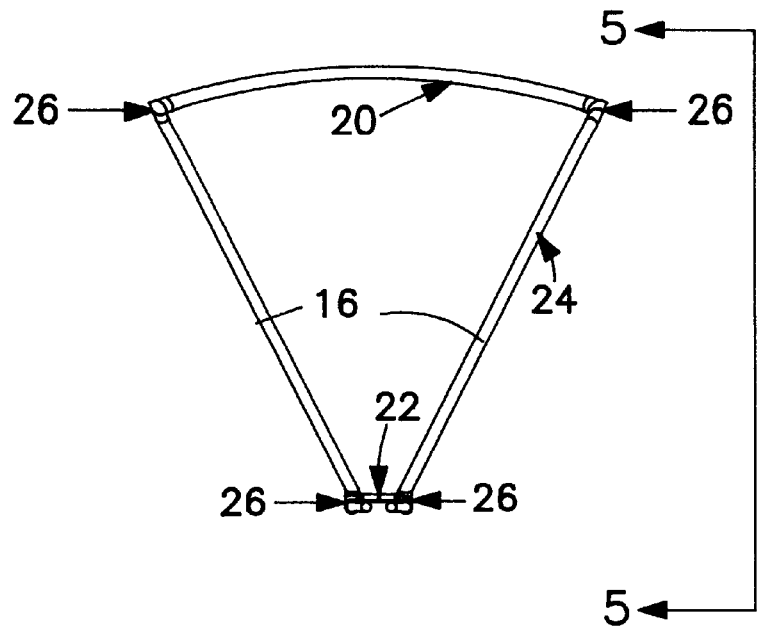
FIG. 4 schematically illustrates a heat pipe connecting element of the solar collector system illustrated by FIGS. 1, 2 and 3.
Figure 5:
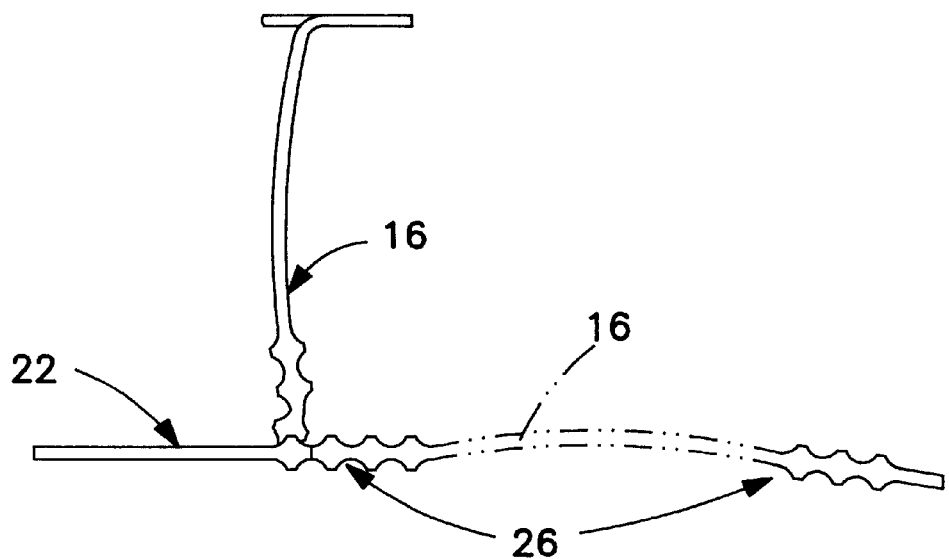
FIG. 5 is a view seen through directional arrows 5—5 of FIG. 4 illustrating a heat pipe in its coiled and in its extended positions in accordance with the present invention.

FIG. 4 schematically illustrates the assembly of a connecting strut/heat pipe 16 disposed between the cylindrical mirror 6 and a photocell substrate panel 14. This assembly is preferably formed in a curved, cross sectional configuration as illustrated by FIG. 5. It is generally formed in the shape of a truncated pyramid having a curved base section designated by reference numeral 20, a substantially planar top portion designated by reference numeral 22, and two tubular side elements designated by reference numeral 24 forming the connecting struts/heat pipe 16. The base 20, the top 22, and the side elements 24 are joined together by four bellows, designated by reference numeral 26, located at the points of intersection of the connecting strut/heat pipe assembly 16. This entire assembly is hermetically sealed and contains an appropriate fluid and wicks which perform the heat transfer function of the heat pipe.

The bellows 26 of the connecting struts 16 allow the connecting struts to flex into their extended operating position without causing any loss of hermeticity as illustrated by FIG. 3, in which the mirror 6 is spaced apart from the substrate 14 in an extended operating position of the solar power system. The system may also employ, in the alternative, hinges or pivots provided at the areas in which the struts 16 are connected to the mirror 6 and the substrate 14, and biasing means, as for example resilient means, urging the connecting struts 16 into their extended operating position. FIG. 5 illustrates a connecting strut/heat pipe 16 in its extended position and also shows the connecting strut/heat pipe 16 in broken line to illustrate its coiled position.

When the system is in its coiled launch position, as illustrated by FIG. 2, the substrate 14 is folded or pivoted onto the top surface of the mirror 16 so that the overall assembly 2 is in a folded or retracted configuration in which the connecting elements (struts) 16 are retracted or pivoted downwardly. The mirror 6, the substrate 14, and the connecting struts 16 are maintained in this folded configuration by the retaining means which maintain the mirror coiled around the outer surface of the spacecraft. However, when the retaining means are released and the mirror is automatically deployed into its extended operating position as discussed above and illustrated by FIG. 1, the bellows or other resilient means acting on the connecting struts 16 are not subject to any opposing force, and thus allow the struts 16 and the overall assembly 2 into its extended operating position in which the substrate 14 and the mirror 6 are spaced apart by the extended struts 16 disposed therebetween. Accordingly, when the retaining means acting on the coiled mirror in the launch mode are released, the system automatically is deployed into its operating position in which the mirror 6 automatically assumes a straightened position (and a cylindrical or arcuate cross-section) and extends longitudinally outwardly from the outer surface of the orbiting spacecraft and its solar tracking mount (8), and the substrate 14 automatically assumes its extended operating position in which it is spaced apart from the mirror 6 by forces applied to the connecting struts 16 disposed therebetween.

In the presently preferred embodiment of the invention, the substrate is pivotably or hingedly mounted to the mirror by the connecting struts (heat pipes) so that as the mirror uncoils and abruptly stops moving when it is fully uncoiled, the substrate continues to move relative to the mirror and thus pivots along the struts to displace the substrate relative to the extended mirror. In the alternative, resilient means can be provided at opposed ends of the connecting element to exert a resilient force on the substrate to pivot it into a displaced position relative to the mirror when the mirror is in its extended operative position.

Figure 6:
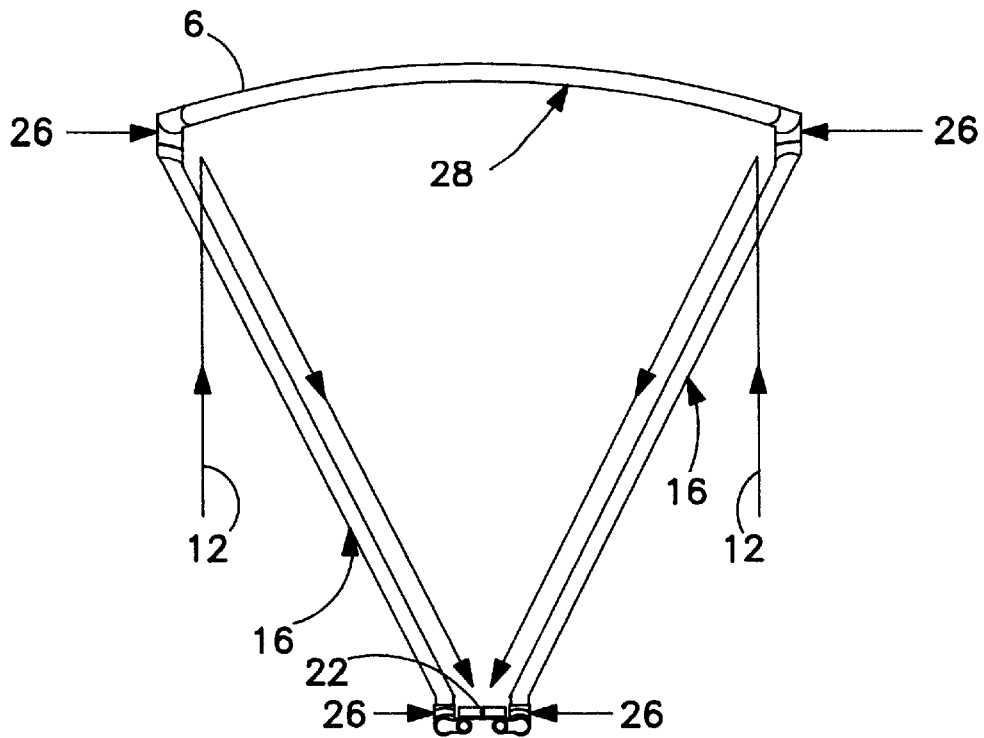
FIG. 6 is a schematic view of the solar collector system illustrated by FIG. 1 in its deployed position.
Figure 7:
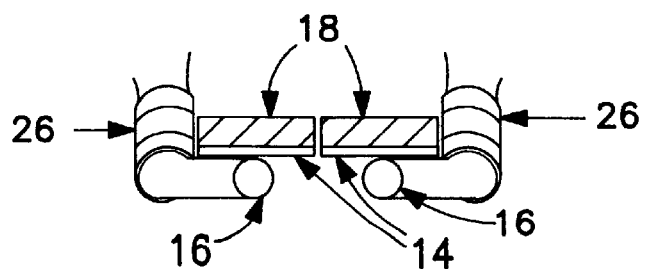
FIG. 7 is a detailed view of the focal plane and solar substrate—flattened heat pipe assembly in accordance with the present invention.

FIGS. 6 & 7 schematically illustrates operation of the solar power system in accordance with the present invention when the system is deployed into its operating position as illustrated by FIGS. 1 and 3. FIG. 6 illustrates, in section, the cylindrical mirror 6 spaced apart from the substrate 14 by one connecting spacer element 16 in an extended operating position. A reflective inner surface 28 of the mirror faces a surface of substrate 14 carrying a photocell array 18. Incoming rays 12 from the sun are reflected by inner surface 28 of the cylindrical mirror 6, onto the photocell array 18 carried by the substrate 14. Accordingly, solar energy is provided to the photocells, which convert the solar energy into electrical energy for powering the spacecraft systems. The inner surface 28 of the mirror 6 is substantially wider than the substrate 14 so as to expose a relatively wide area of the reflective surface 28 to the incoming rays 12. The reflective surface 28 concentrates the reflected rays 12 onto the narrower surface area of the substrate 14.

The substrate 14 is formed from a heat conducting material, as for example, aluminum or beryllium. The connecting spacer element 16 is also formed from a lightweight, heat conductive material such as aluminum. In this manner, heat from the reflected sun rays will flow along the substrate 14 to the heat conductive elements 16, and will continue to flow through the elements 16 towards the mirror 6 to be emitted from the blackened rear surface of the mirror, which, as discussed above, acts as a near unity emissitivity heat radiator. Because the front surface 28 of the mirror always faces towards the sun, the rear surface of the mirror always faces away from the sun. Heat energy from the substrate 14 is therefore dissipated from the operating system through the heat conductive element 16 and emitted into space by the rear surface of the mirror 6. The continuous dissipation of heat from the substrate 14 enhances the overall efficiency of the solar collector system and extends the useful operating life of the photocells carried by the substrate.

The solar power system described above with reference to FIGS. 1–7 is efficient, lightweight, requires no mechanical apparatus for automatic deployment of the system from a stored launch mode to an extended operating mode, and provides means for heat removal from the photocells employing pre-existing supporting structure for the operating system. FIGS. 8–11, to be discussed below, illustrate a second embodiment of a solar power system for a spacecraft in accordance with the present invention. Elements illustrated in FIGS. 8–11 which correspond to elements illustrated in FIGS. 1–7, have been designated with the same reference numerals.

Figure 8:
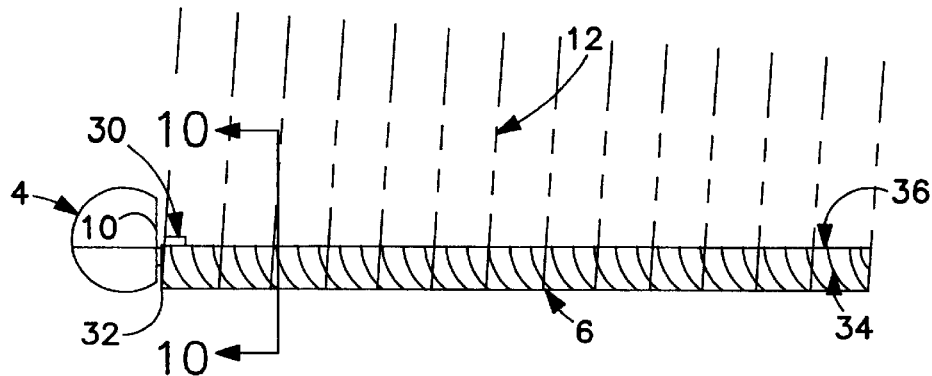
FIG. 8 illustrates a second embodiment of a solar power system in accordance with the present invention in its deployed position extending outwardly from an orbiting spacecraft.
Figure 9:
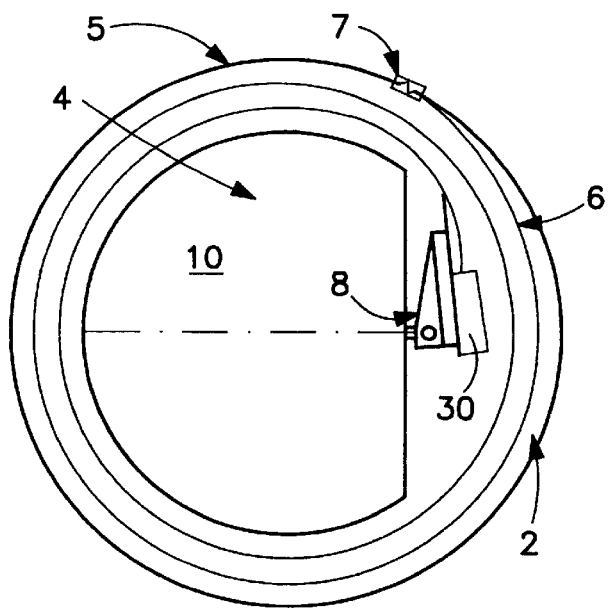
FIG. 9 illustrates the system of FIG. 8 in its coiled launch position.
Figure 10:
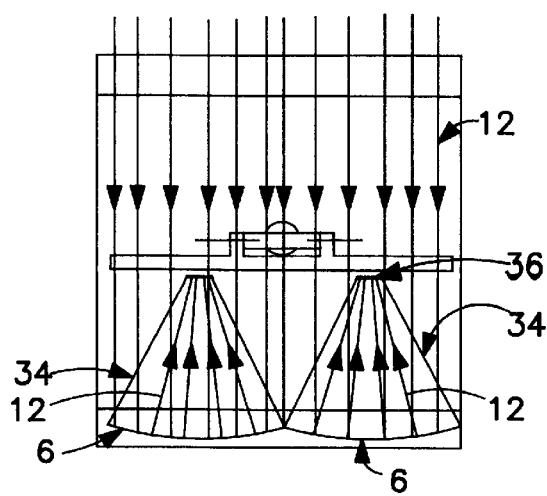
FIG. 10 is a sectional view taken along directional arrows 10—10 of FIG. 8.

FIGS. 8, 9, and 10 are generally similar to FIGS. 1, 2 and 3, respectively. The previous description herein of the mechanical operation of the system described with respect to FIGS. 1–3 is applicable to the mechanical operation of the system illustrated by FIGS. 8–10. In the launch mode of the system illustrated by FIGS. 8–10, the solar power assembly 2 is coiled around the outer surface of the spacecraft 4 and maintained in its coiled position by retaining means, such as fusible straps 5 wrapped around the outer surface of the coil. In its orbiting operational position, the solar power system 2 extends longitudinally from the outer surface of the spacecraft so that the reflective surface of the extended concentrating cylindrical mirror 6 always faces in a direction towards the sun. As discussed with respect to the earlier embodiment, the mirror is formed from a resilient material which has "memory" biasing it in a longitudinally extending orientation, and the connecting struts 34 disposed between the mirror 6 and the substrate 36 are biased to assume an extended operating position when the mirror is deployed into its longitudinally extended operating position. Therefore, as discussed with respect to the earlier embodiment, when the retaining means are released, the solar power system is automatically deployed into its extended operation position as illustrated by FIGS. 8 and 10. The discussion of the mechanical deployment of the system illustrated by FIGS. 1, 2, 3, 4–5, and 6–7 is incorporated by reference herein as disclosing the means for automatic mechanical deployment of the solar power system illustrated by FIGS. 8, 9 and 10.

In contrast to the earlier discussed embodiment illustrated by FIGS. 1–7, the substrate 14 of the embodiment illustrated by FIGS. 8–11, which is formed from a heat conductive material, does not contain any photocells. Additionally, the connecting struts 34 are formed from a heat insulated material to prevent heat flow therethrough. An electric generator for converting thermal energy into electrical energy, designated by reference numeral 30, is located within the spacecraft and coupled in thermal flow relationship to the proximal end 32 of the heat conductive substrate 36 extending from the outer surface of the spacecraft. The generator 30, which can be a Stirling Cycle electric generator, converts thermal energy collected on the substrate into electrical energy. The substrate 36 is formed from a material having a high ratio of solar absorbtivity as compared to thermal emissitivity. One such material is copper or stainless steel coated with black chrome which has an absorbtivity greater than 0.9 in the 0.3–1.0 micron wavelength region where most of the sun's energy is located, and relatively low thermal emissitivity (e.g., less than 0.1 in the 2–30 micron wavelength region). In this manner, the temperature of the substrate 36 is maximized (e.g., exceeding 1000° C.) as a result of the solar energy reflected onto the substrate by the concentrator cylindrical mirror 6. The thermal energy collected on the substrate 36 flows along the continuous heat condutive substrate to the input of the generator 30 which is in thermal communication with the substrate 14 at the proximal end thereof within the spacecraft. The generator converts the thermal energy input into electrical energy for powering the systems of the orbiting spacecraft. Since the connecting struts 16 are formed from or coated with non-thermal conductive material, heat flowing along the substrate 36 is not dissipated or diverted through the connecting struts 34 so that the thermal energy input to the generator 30 is continuous and uninterrupted to maximize such thermal input.

Figure 11:
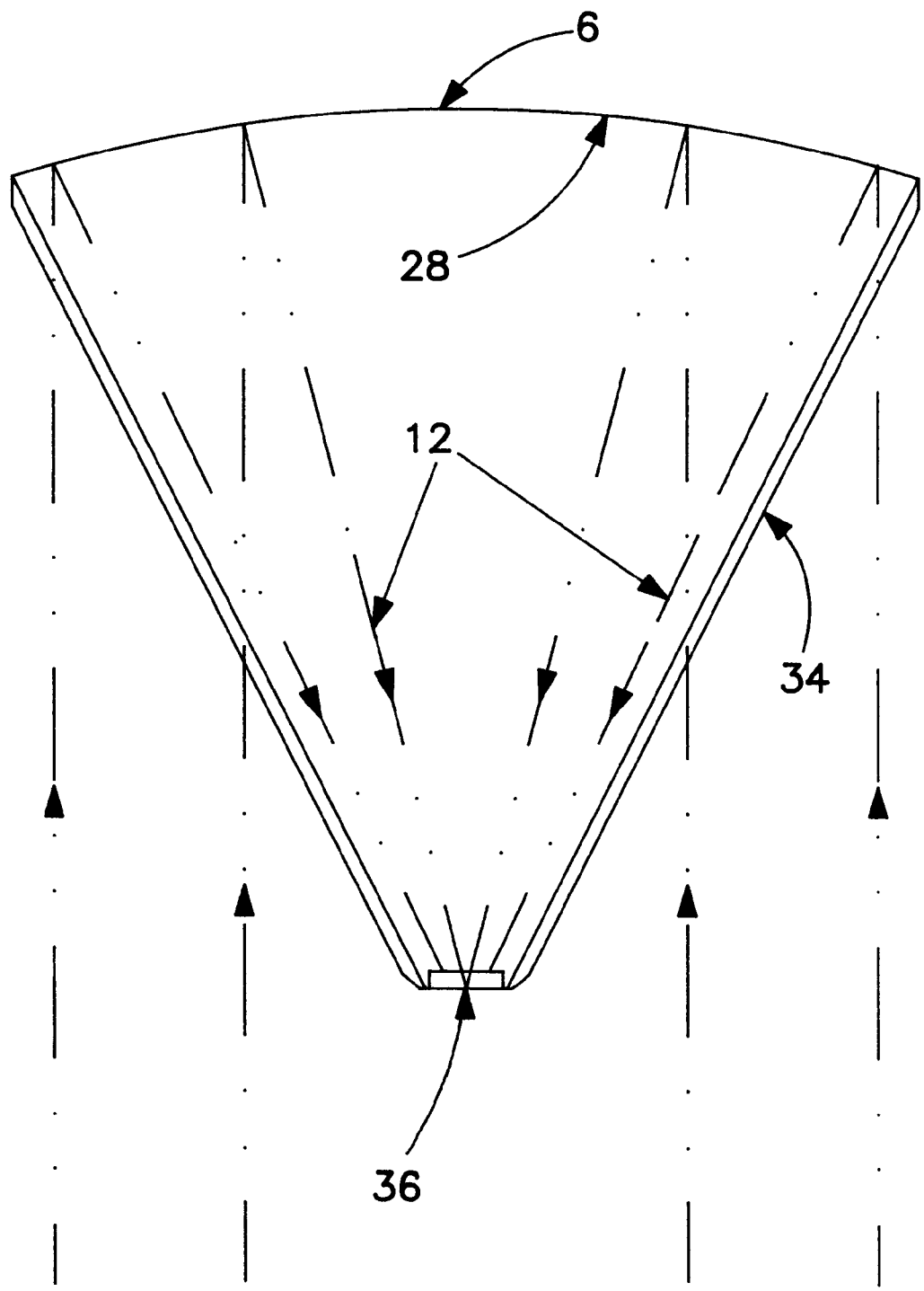
FIG. 11 is a schematic view of the solar collector system illustrated by FIG. 8 in its deployed position.

FIG. 11 is a schematic, sectional view of the solar power system illustrated by FIGS. 8 and 10 in its extended, deployed, operating position. Energy rays 12 from the sun are reflected by inner surface 28 of mirror 6 and focused on the underside of substrate 36. The width of the cylindrical mirror 6 is greater than the width of the substrate 36 so as to maximize the area of the inner surface of the mirror 28 which is exposed to incoming rays. The surface of the substrate 36 which faces the reflective surface of the mirror 6 is coated with a thermal absorbing material, and the substrate is formed from a thermally conductive material. The solar energy rays reflected onto the substrate 36 result in absorption of thermal energy which is conducted along the substrate 36 and provided as input to the generator 30 as discussed with respect to FIG. 8. The connecting elements 34 are formed from thermal insulating material to prevent diversion of heat flow along the substrate 34 and into the generator 30. In the embodiment of the invention illustrated by FIGS. 8–11, the substrate 36 is formed from a continuous panel to provide continuous and uninterrupted heat flow into the input of the generator 30. In the embodiment of the invention discussed with respect to FIGS. 1–7, the substrate 14, which contained the solar cells, is formed from separate panel sections connected to each, each of the separate panel section containing a different photocell, to inhibit continuous thermal flow and to permit rapid dissipation of thermal energy from each separate panel section through the heat conductive connecting elements 16.

Other variations and modifications falling within the scope of the present invention will be apparent to those skilled in the art. Accordingly, the above discussion of the preferred embodiments of the invention are intended to be illustrative only and not intended to be restrictive of the scope of the invention, that scope being defined by the following claims and all equivalents thereto.

I claim:

1. A solar power collector system for a spacecraft, said system including a substrate and photocell means on said substrate, a mirror for reflecting light onto said photocell means, and retaining means for maintaining said mirror and said photocell means coiled around at least a portion of an outer surface of the spacecraft.

2. The system as claimed in claim 1 further including means for selectively releasing said retaining means to permit said mirror and said photocell means to uncoil.

3. The system as claimed in claim 2 wherein said mirror is formed from a flexible material biased to extend outwardly from said spacecraft in a straight orientation in the absence of an opposing force applied thereto.

4. The system as claimed in claim 3 wherein said mirror extends longitudinally outwardly from a portion of the outer surface of said spacecraft when said retaining means is released.

5. The system as claimed in claim 4 further including means for coupling said substrate to said mirror such that said substrate extends longitudinally outwardly from said spacecraft and parallel to said mirror when said retaining means is released.

6. The system as claimed in claim 5 wherein said means for coupling includes spacer means disposed between said substrate and said mirror for maintaining said substrate and said mirror separated by a predetermined distance when said mirror extends longitudinally from said outer surface of said spacecraft.

7. The system as claimed in claim 6 wherein said spacer means comprises at least one heat conductive element for conducting heat from said substrate and towards said mirror.

8. The system as claimed in claim 6 wherein said spacer means comprises at least one connecting element having two opposed ends, one of said opposed ends being pivotably mounted to said substrate, and the other of said opposed ends being pivotably mounted to said mirror.

9. The system as claimed in claim 8 wherein said at least one connecting element is formed, at least in part, from a heat conductive material.

10. The system as claimed in claim 6 further including biasing means operatively associated with said spacer element for biasing said mirror and said substrate into an extended operative position in which said mirror and said substrate are separated by a predetermined distance when said mirror extends longitudinally from said outer surface of said spacecraft.

11. The system as claimed in claim 10 wherein said spacer means includes at least one connecting element having a first end pivotably mounted to said substrate and a second end pivotably mounted to said mirror, said means for biasing including means for applying a resilient force to said connecting element in a direction urging said mirror and said substrate into said extended operating position.

12. The system as claimed in claim 11 wherein said connecting element is formed, at least in part, from a heat conductive material such that thermal energy on said substrate is removable therefrom by flowing through said connecting element.

13. The system as claimed in claim 12 wherein said substrate is formed from a plurality of interconnected panels, each of said panels carrying a photocell array, and each of said panels being connected to said mirror by at least one of said connecting elements.

14. The system as claimed in claim 1 wherein said retaining means includes at least one strap engaging said mirror when said mirror is coiled around a portion of said outer surface of said spacecraft.

15. The system as claimed in claim 14 further including means for disengaging said strap from said mirror to permit said mirror to uncoil and extend longitudinally from said outer surface of said spacecraft.

16. The device as claimed in claim 3 wherein said mirror is biased into an arcuate cross-sectional configuration when said mirror is extended in said substantially straight orientation.

17. The device as claimed in claim 7 wherein said at least one heat conductive element comprises a heat pipe.

18. The device as claimed in claim 9 wherein said at least one connecting element comprises a heat pipe.

19. A solar power system for a spacecraft, said system including a substrate formed, at least in part, from a heat conductive material; a mirror for reflecting heat energy onto said substrate; and means for retaining said substrate and said mirror coiled around at least a portion of the outer surface of said spacecraft.

20. The system as claimed in claim 19 further including means for selectively releasing said retaining means to permit said mirror to uncoil.

21. The system as claimed in claim 20 wherein said mirror is formed from a flexible material biased to extend outwardly from said spacecraft in a straight orientation in the absence of an opposing force applied thereto.

22. The system as claimed in claim 21 further including means for coupling said substrate to said mirror such that said substrate extends longitudinally outwardly from said spacecraft and parallel to said mirror when said retaining means is released.

23. The system a claimed in claim 22 wherein said means for coupling includes including spacer means disposed between said mirror and said substrate.

24. The system as claimed in claim 23 wherein said spacer means is formed, at least in part, from a thermally insulating material.

25. The system as claimed in claim 24 further including means operatively associated with said spacer means for biasing said spacer means to maintain said substrate and said mirror in an extended operating positon in which said mirror and said substrate are spaced apart by a predetermined distance when said mirror is uncoiled and extends longitudinally from said spacecraft.

26. The system as claimed in claim 25 wherein said spacer means comprises at least one connecting element having opposed ends, one of said opposed ends being pivotably mounted to said substrate, and the other of said opposed ends being pivotably mounted to said mirror.

27. The device as claimed in claim 25 wherein said substrate is formed in a continuous, unitary configuration.

28. The system as claimed in claim 19 including a generator for converting thermal energy into electrical energy, said generator being operatively associated with said substrate for receiving thermal energy therefrom.

29. The device as claimed in claim 19 wherein said mirror is oriented relative to said spacecraft such that a reflective surface of said mirror faces in the direction of the sun when said mirror is uncoiled and extends longitudinally from said spacecraft.

30. The device as claimed in claim 21 wherein said mirror is biased into an arcuate cross-sectional configuration when said mirror is extended in said straight orientation.

31. A solar power system for a spacecraft, said solar power system including a mirror and a substrate carrying a photocell coiled around a portion of the outer surface of said spacecraft; a connecting element disposed between said mirror and said substrate; said mirror formed from a flexible material and biased to extend longitudinally from said spacecraft; said connecting element being biased to maintain said mirror and said substrate in an extended operating position spaced a predetermined distance apart from each other; means for retaining said mirror and said substrate coiled around the outer surface of said spacecraft; means for selectively releasing said retaining means to permit said mirror to uncoil; wherein said mirror extends longitudinally outwardly from said spacecraft, and said mirror is spaced apart from said substrate in said extended operating position, resulting from said bias applied by said connecting element when said mirror is uncoiled by releasing said retaining means.

32. The system as claimed in claim 31 wherein said connecting element is formed, at least in part, from a thermally conductive material.

\* \* \* \* \*